(12) United States Patent
Hartmann et al.

(10) Patent No.: US 11,676,933 B2
(45) Date of Patent: Jun. 13, 2023

(54) ARRANGEMENT AND METHOD FOR JOINING AT LEAST TWO JOINING PARTNERS

(71) Applicant: Infineon Technologies AG, Neubiberg (DE)

(72) Inventors: Steffen Hartmann, Bad Sassendorf (DE); Roland Speckels, Kamen (DE)

(73) Assignee: Infineon Technologies AG, Neubiberg (DE)

( * ) Notice: Subject to any disclaimer, the term of this patent is extended or adjusted under 35 U.S.C. 154(b) by 521 days.

(21) Appl. No.: 16/806,844

(22) Filed: Mar. 2, 2020

(65) Prior Publication Data

US 2020/0294956 A1    Sep. 17, 2020

(30) Foreign Application Priority Data

Mar. 12, 2019 (EP) .................................. 19162070

(51) Int. Cl.
*H01L 23/00* (2006.01)

(52) U.S. Cl.
CPC .............. *H01L 24/75* (2013.01); *H01L 24/83* (2013.01); *H01L 24/32* (2013.01);
(Continued)

(58) Field of Classification Search
CPC ......... H01L 24/75; H01L 24/83; H01L 24/32; H01L 2224/32225; H01L 2224/75252; H01L 2224/75301; H01L 2224/7555; H01L 2224/7565; H01L 2224/75821; H01L 2224/83053; H01L 2224/83203;
(Continued)

(56) References Cited

U.S. PATENT DOCUMENTS

2007/0298539 A1* 12/2007 Kim ..................... H01L 24/83
                                                         438/108
2009/0289097 A1    11/2009 Wu et al.
(Continued)

FOREIGN PATENT DOCUMENTS

CN          101874288 A      10/2010
DE     102010020696 A1      11/2011
(Continued)

*Primary Examiner* — Jasmine J Clark
(74) *Attorney, Agent, or Firm* — Murphy, Bilak & Homiller, PLLC

(57) ABSTRACT

An arrangement for joining two joining members includes a first part having a support surface, a first carrier element configured to carry at least one foil, a transportation unit configured to arrange the first carrier element such that the foil is arranged above the support surface in a vertical direction, and a second part configured to exert pressure to a joining stack, when the joining stack is arranged on the support surface. The joining stack includes a first joining member arranged on the support surface, a second joining member, and an electrically conductive connection layer arranged between the joining members. When pressure is exerted on the joining stack, the foil is arranged between the second part and the joining stack and is pressed onto the joining stack and the joining stack is pressed onto the first part, compressing the connection layer and forming a bond between the joining members.

20 Claims, 5 Drawing Sheets

(52) U.S. Cl.
CPC ............... *H01L 2224/32225* (2013.01); *H01L 2224/7555* (2013.01); *H01L 2224/7565* (2013.01); *H01L 2224/75252* (2013.01); *H01L 2224/75301* (2013.01); *H01L 2224/75821* (2013.01); *H01L 2224/83053* (2013.01); *H01L 2224/8384* (2013.01); *H01L 2224/83203* (2013.01)

(58) Field of Classification Search
CPC ... H01L 2224/8384; H01L 2224/75101; H01L 2224/75102; H01L 2224/7531; H01L 2224/75315; H01L 2224/75316; H01L 2224/75983; H01L 2224/29339; H01L 2224/32227; H01L 2224/75251; H01L 2224/75312; H01L 2224/75314; H01L 2224/7532; H01L 2224/75704; H01L 2224/75755; H01L 2224/75984; H01L 2224/8301; H01L 2224/83022; H01L 2224/8391; H01L 2224/83948; H01L 24/80; H01L 24/741; H01L 2224/741; H01L 2224/80203; H01L 21/603
See application file for complete search history.

(56) References Cited

U.S. PATENT DOCUMENTS

| | | | |
|---|---|---|---|
| 2010/0024667 | A1 | 2/2010 | Ikura |
| 2010/0206454 | A1* | 8/2010 | Maeda .................... H01L 21/30 156/60 |
| 2017/0144246 | A1 | 5/2017 | Bogen et al. |
| 2019/0016487 | A1 | 1/2019 | Capitani |

FOREIGN PATENT DOCUMENTS

| | | |
|---|---|---|
| EP | 2506295 A2 | 10/2012 |
| EP | 3279928 A1 | 2/2018 |
| EP | 3428954 A1 | 1/2019 |
| JP | 2000068633 A | 3/2000 |
| JP | 2004296746 A | 10/2004 |
| JP | 3663931 B2 | 4/2005 |
| NL | 2015895 B1 | 6/2017 |
| WO | 2016050468 A1 | 4/2016 |
| WO | 2017137420 A2 | 8/2017 |
| WO | 2018122795 A1 | 7/2018 |
| WO | 2018215524 A1 | 11/2018 |

* cited by examiner

ARRANGEMENT AND METHOD FOR JOINING AT LEAST TWO JOINING PARTNERS

TECHNICAL FIELD

The instant disclosure relates to an arrangement and method for joining at least two joining partners, in particular for sintering semiconductor components to a semiconductor substrate.

BACKGROUND

Power semiconductor module arrangements often include at least one semiconductor substrate arranged in a housing. A semiconductor arrangement including a plurality of controllable semiconductor components (e.g., two or more IGBTs in a half-bridge configuration) is usually arranged on at least one of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor components are mounted, for example, on the first metallization layer. Usually, the semiconductor components are sintered to the semiconductor substrate. A sinter layer is arranged between each of the semiconductor components and the semiconductor substrate and the semiconductor components are then pressed onto the sinter layer by exerting a defined pressure. Often, hard punches are used to exert the pressure. In order to evenly distribute the pressure and to protect the semiconductor components from damage and contamination by potentially harmful substances, one or more foils are usually arranged between the punches and the semiconductor components.

There is a need for an improved arrangement and method that allow for an easy, quick, defined and precise positioning of the joining partners, foils and punches.

SUMMARY

An arrangement for joining two joining members includes a first part comprising a support surface, a first carrier element configured to carry at least one foil, a transportation unit configured to arrange the first carrier element with at least one foil arranged thereon in such a way that the at least one foil is arranged above the support surface of the first part in a vertical direction, and a second part configured to exert pressure to a joining stack, when the joining stack is arranged on the support surface. The joining stack comprises a first joining member arranged on the support surface, a second joining member arranged on the first joining member, and an electrically conductive connection layer arranged between the first joining member and the second joining member. When pressure is exerted on the joining stack by the second part, the at least one foil is arranged between the second part and the joining stack and is pressed onto the joining stack, and the joining stack is pressed onto the first part, thereby compressing the connection layer and forming a substance-to-substance bond between the first and the second joining member.

A method includes arranging a first joining member, an electrically conductive connection layer, and a second joining member on a support surface of a first part, wherein the electrically conductive connection layer is arranged between the first joining member and the second joining member. The method further includes arranging at least one foil on a first carrier element, using a transportation unit to arrange the first carrier element in such a way that the at least one foil is arranged above the support surface of the first part in a vertical direction, and exerting pressure to the joining stack by means of a second part, wherein, when the at least one foil is arranged above the support surface and pressure is exerted on the joining stack by the second part, the at least one foil (is arranged between the second part and the joining stack and is pressed onto the joining stack, and the joining stack is pressed onto the first part, thereby compressing the connection layer and forming a substance-to-substance bond between the first and the second joining member.

The invention may be better understood with reference to the following drawings and the description. The components in the figures are not necessarily to scale, emphasis is instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
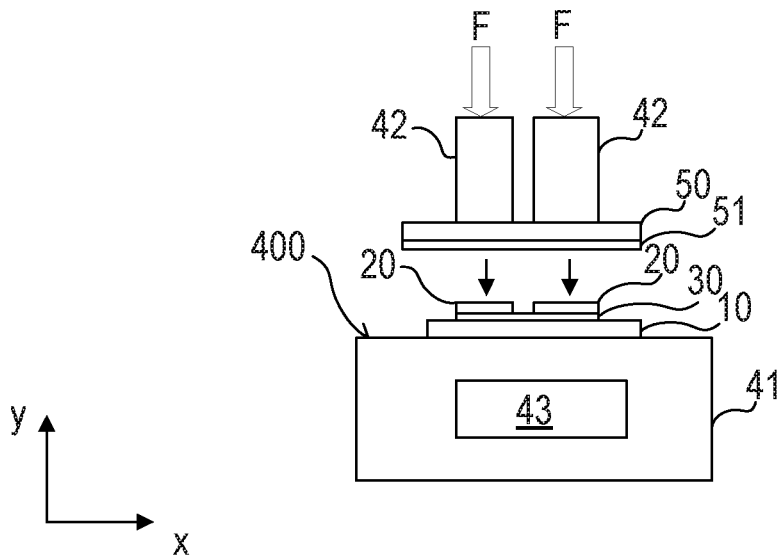
FIG. 1 illustrates a cross-sectional view of an arrangement for joining two joining members.

Referring to FIG. 1, an arrangement for joining two joining members is illustrated. The arrangement comprises a first part 41 such as, e.g., an anvil. A first joining member 10 and at least one second joining member 20 may be arranged on the first part 41. The first part 41 may provide a flat support surface 400, for example, on which the joining members 10, 20 may be arranged. Usually, the first joining member 10 is arranged on the support surface 400 of the first part 41, and between the at least one second joining member 20 and the first part 41. An electrically conductive connection layer 30 may be arranged between the first joining member 10 and the second joining member 20. The electrically conductive connection layer 30 generally may be a layer of a metal powder, e.g., a silver powder.

The arrangement further comprises a second part 42. The second part 42 may be configured to exert pressure to the joining members 10, 20, as is indicated with the arrows in FIG. 1. In this way, the at least one second joining member 20 is pressed against the first joining member 10. For example, the second part 42 may comprise one or more punches. The second part 42 may be made of metal, for example. Punches comprising a metal or any other comparably hard materials are often also called hard punches.

Usually, the first part 41 and the second part 42 are heated during the process of joining the joining members 10, 20. Such a process often is a so-called sintering process. It is, however, also possible that only one of the first part 41 and the second part 42 is heated during the joining process or that heat is applied in any other way. A heating element 43 is exemplarily illustrated for the first part 41 in FIG. 1. A heating element, however, is not specifically illustrated for the second part 42 in the Figure. For example, at least one of the first and the second part 41 and 42 may be heated to up to 100° C., up to 200° C., up to 300° C. or even more. In this way, the first joining member 10 and the second joining member 20 which are in direct or indirect contact with the first part 41 and the second part 42, respectively, are heated by the first part 41 and/or the second part 42 and the heat is further transferred via the joining members 10, 20 to the connection layer 30. The connection layer 30 is compacted during this process and subsequently forms a solid substance-to-substance bond between the two joining members 10, 20. Such sintering processes are generally known and, therefore, will not be described in further detail.

The first joining member 10 may be a semiconductor substrate, for example. Semiconductor substrates often include a dielectric insulation layer, a first metallization layer attached to the dielectric insulation layer, and a second metallization layer attached to the dielectric insulation layer. The dielectric insulation layer is disposed between the first and second metallization layers.

Each of the first and second metallization layers may consist of or include one of the following materials: copper; a copper alloy; aluminum; an aluminum alloy; any other metal or alloy that remains solid during the operation of the power semiconductor module arrangement. The semiconductor substrate may be a ceramic substrate, that is, a substrate in which the dielectric insulation layer is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer may consist of or include one of the following materials: $Al_2O_3$, AlN, or $Si_3N_4$. For instance, the substrate may, e.g., be a Direct Copper Bonding (DCB) substrate, a Direct Aluminum Bonding (DAB) substrate, or an Active Metal Brazing (AMB) substrate. Further, the substrate may be an Insulated Metal Substrate (IMS). An Insulated Metal Substrate generally comprises a dielectric insulation layer comprising (filled) materials such as epoxy resin or polyimide, for example. The material of the dielectric insulation layer may be filled with ceramic particles, for example. Such particles may comprise, e.g., $Si_2O$, $Al_2O_3$, AlN, or BrN and may have a diameter of between about 1 μm and about 50 μm. The first metallization layer of an IMS may be a comparably thin copper layer (e.g., thickness of between 35 μm and 140 μm), and the second metallization layer may be a comparably thick aluminum or copper layer (e.g., thickness of between 0.6 mm and 2.0 mm), for example. The dielectric insulation layer generally comprises a high insulation resistance while, at the same time, having a low thermal conduction coefficient. The substrate, however, may also be a conventional printed circuit board (PCB) having a non-ceramic dielectric insulation layer. For instance, a non-ceramic dielectric insulation layer may consist of or include a cured resin.

The at least one second joining member 20 may comprise one or more semiconductor bodies, for example. Usually one or more semiconductor bodies are arranged on a semiconductor substrate. Each of the semiconductor bodies arranged on a semiconductor substrate may include a semiconductor component such as a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element. One or more semiconductor components may form a semiconductor arrangement on the semiconductor substrate. In FIG. 1, two second joining members 20 are exemplarily illustrated. Any other number of second joining members 20, however, is also possible.

The first joining member 10 comprising a semiconductor substrate and the at least one second joining member 20 comprising at least one semiconductor component, however, is only an example. According to another example, the at least one second joining member 20 comprises at least one semiconductor substrate that is arranged on a first joining member 10 comprising a base plate or heat sink, with the second metallization layer of the semiconductor substrate arranged between the dielectric insulation layer and the base plate/heat sink. For example, only one substrate may be arranged on a base plate or heat sink. It is, however, also possible that two or more substrates are arranged on the same base plate/heat sink. Any other joining members, however, are also possible.

During the joining process, at least one foil 50, 51 may be arranged between the second part 42 and the joining stack formed by the first joining member 10, the second joining member 20 and the electrically conductive connection layer 30. For example, a compensation foil 50 may be arranged between the joining stack and the second part 42 in order to evenly distribute a pressure exerted by the second part 42. The compensation foil 50 may comprise a comparably soft and heat-resistant material. Heat-resistant in this context refers to a material that is able to withstand temperatures occurring during the sintering process without significant deformations. That is, the material may be dimensionally stable up to a certain temperature. For example, the material may be heat-resistant up to temperatures of between 150° C. and 250° C. However, if temperatures of more than 250° C. occur during the sintering process, it may be required that the material is heat-resistant even up to temperatures greater than 300° C. Many rubbery or rubber materials, for example, are both comparably soft as well as heat-resistant. Further, many elastomers are comparably soft and heat-resistant. One example of a suitable material is silicone. Another example is a so-called Kalrez material. Many other materials, however, are also possible. A protective foil 51 may be arranged below the compensation foil 50 such that the protective foil 51 is arranged between the compensation foil 50 and the joining stack arranged on the first part 41. The protective foil 51 may be configured to prevent contaminants from contaminating the joining members 10, 20. Contaminants may originate from the compensation foil 50, for example. E.g., particles or substances may detach from the compensation foil 50. Alternatively or additionally, contaminants may comprise any other potentially harmful substances or materials that may negatively affect the joining partners 10, 20 or the connection layer 30. The protective foil 51 may comprise an inert polymer (e.g., Polytetrafluoroethylene PTFE, or Perfluoroalkoxy alkane PFA) or a polyimide, for example. A size (length, width) of the at least one foil 50, 51 in a horizontal plane (parallel to the support surface 400) may be chosen such that a foil stack formed by the at least one foil 50, 51 completely covers the joining stack formed by the first joining member 10, the second joining member 20, and the connection layer 30.

The at least one foil 50, 51 may be arranged on the joining stack formed by the joining members 10, 20 manually. Other arrangements are known where one or more foils 50, 51 are provided using a roll-to-roll process. However, the handling of a foil and especially of a foil stack comprising more than one foil is a delicate process and needs to be carried out such that the foils are arranged accurately above the joining stack.

Figure 2:
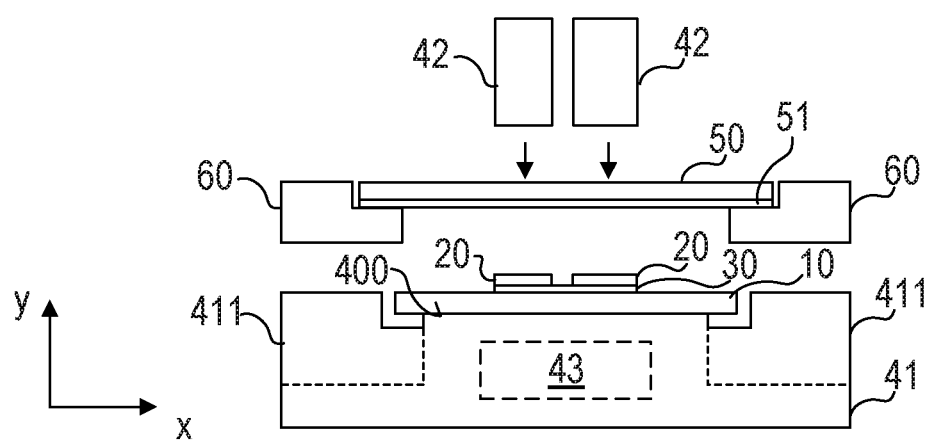
FIG. 2 schematically illustrates a cross-sectional view of another arrangement for joining two joining members before performing the step of joining the joining members.

Now referring to FIG. 2, an arrangement according to one example further comprises a first carrier element 60. The first carrier element 60 is configured to carry the at least one foil 50, 51. According to one example, the first carrier element 60 comprises a frame, wherein the at least one foil 50, 51 is configured to be arranged within the frame. Each foil 50, 51 may be provided on a reel or roll and a piece of foil having a desired size may be cut off the reel or roll and may be arranged on the first carrier element 60. For example, the first carrier element 60 may comprise a projection, wherein the at least one foil 50, 51 may be arranged on the projection and inside the frame, as is schematically illustrated in FIG. 2. The frame may prevent the foils from shifting out of place. For example, the size of the foils may be chosen in accordance with the size of the frame such that shifting of the foils is prevented.

Figure 6:
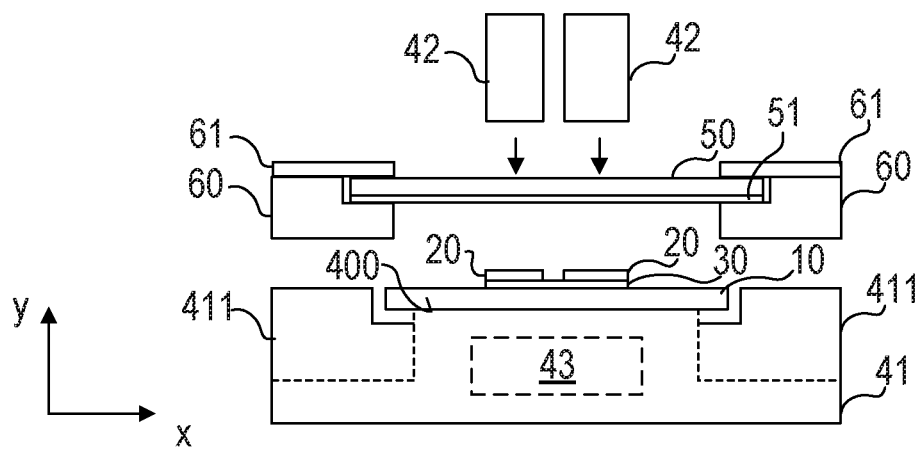
FIG. 6 schematically illustrates a cross-sectional view of another arrangement for joining two joining members.

According to another example, the first carrier element 60 comprises fastening or holding means. For example, the at least one foil 50, 51 may be held in place by means of brackets, clamps or any other suitable fastening means. Such fastening means may be connected to the frame of the first carrier element 60, for example. An exemplary arrangement comprising first fastening means 61 is schematically illustrated in FIG. 6. In the example illustrated in FIG. 6, first holding means 61 are arranged on the frame of the first carrier element 60 such that they partly overlap with the at least one foil 50, 51 and prevent the at least one foil 50, 51 from lifting off the first carrier element 60 in a vertical direction y that is perpendicular to the support surface 400.

The carrier element 60 may be arranged on or above the first part 41 such that the at least one foil 50, 51 that is arranged on the carrier element 60 is arranged above the support surface 400 in a vertical direction y. For example, the carrier element 60 may be arranged on or above the first part 41 by means of a transportation unit (not specifically illustrated in FIG. 2). The transportation unit may comprise means configured to pick up the carrier element 60, e.g., from an assembly position, and transport or convey it to its final resting position on or above the first part 41. According to one example, the transportation unit comprises a robotic unit such as a robotic arm, for example. Any other suitable transportation units are also possible. This makes manual handling of the foils 50, 51 and of the carrier element 60 superfluous.

Again referring to FIG. 2, a cross-sectional view of the arrangement is illustrated before arranging the first carrier element 60 with the at least one foil 50, 51 in a resting position. The first carrier element 60 is illustrated at a certain distance from the stack of joining members 10, 20 in the vertical direction y.

Figure 3:
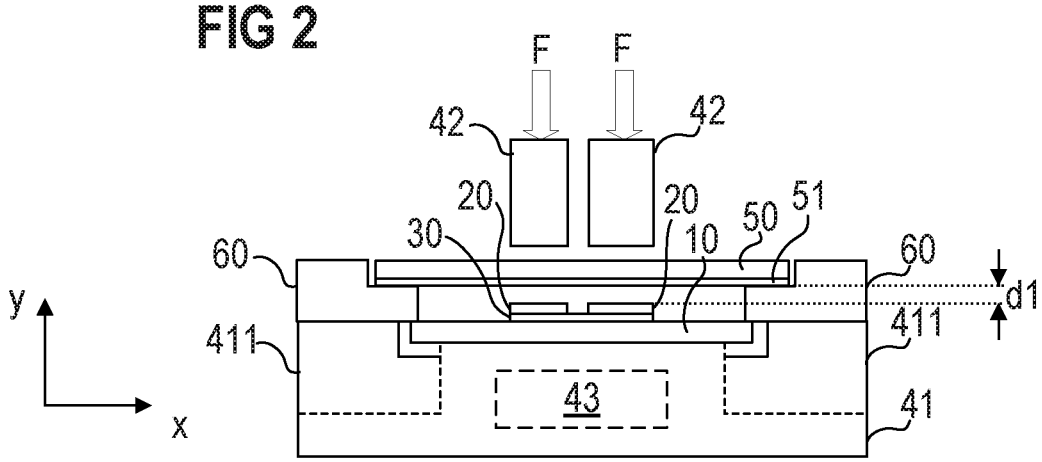
FIG. 3 schematically illustrates a cross-sectional view of the arrangement of FIG. 2 before performing the step of joining the joining members.

Now referring to FIG. 3, the first carrier element 60, by means of the transportation unit, may be lowered onto the first part 41 until it reaches a final resting position. For example, the first part 41 may comprise first sections 411 protruding in the vertical direction y. The first sections 411 may be formed integrally with the first part 41 (first part 41 and first sections 411 formed as a single piece) or may be formed separately (first part 41 and first sections 411 formed as separate pieces). The first sections 411 may protrude in the vertical direction y such that, when the first carrier element 60 has reached its resting position, the at least one foil 50, 51 arranged on the first carrier element 60 is not in direct contact with the at least one second joining member 20. That is, a gap remains between the stack of joining members 10, 20 and the at least one foil 50, 51. The lowermost of the at least one foil 50, 51, which is usually the protective foil 51, therefore, is arranged at a first distance d1 from the uppermost surface of the stack of joining members 10, 20. The foil does not contact the joining stack, that is, d1>0. For example, d1 may be at least 1 mm. The uppermost surface of the stack of joining members 10, 20 is usually a top surface of the at least one second joining member 20 which faces away from the first joining member 10.

In this way, protective gases may reach the top surface of the joining stack before exerting a force to the joining members 10, 20. The arrangement may be arranged in a process chamber (not specifically illustrated in FIGS. 2-4), and a controlled atmosphere may be created inside the process chamber. For example, such a process chamber may be filled with a protective gas at a certain pressure. Such a protective gas may also fill the gap between the stack of joining members 10, 20 and the at least one foil 50, 51 after arranging the first carrier element 60 in its resting position. The protective gas may prevent the joining members 10, 20 and the connection layer 30 from oxidation and/or any other kind of corrosion. Instead of filling the process chamber with a protective gas, a vacuum may be generated inside the process chamber, for example. A protective gas may comprise nitrogen, for example.

Figure 4:
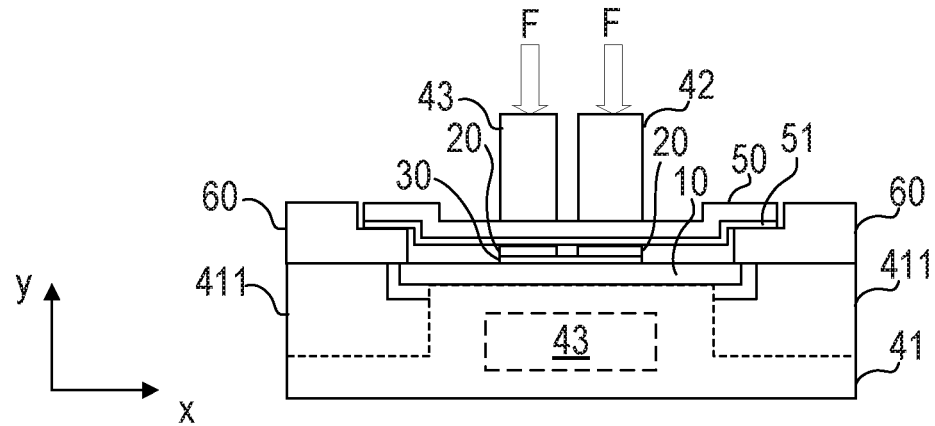
FIG. 4 schematically illustrates a cross-sectional view of the arrangement of FIG. 2 while joining the joining members.

As is illustrated in FIG. 4, a force F may subsequently be exerted on the stack of joining members 10, 20 by means of the second part 42. For example, the second part 42 may be arranged above the stack of joining members 10, 20 and the at least one foil 50, 51 in the vertical direction y. When the second part 42 is lowered towards the joining stack, the at least one foil 50, 51 is deformed and pressed on the stack of joining members 10, 20. At the same time, the stack of joining members 10, 20 may be heated. The connection layer 30 is compacted and hardened in this way and subsequently forms a substance-to-substance bond between the first joining member 10 and the second joining member 20. The at least one foil 50, 51 may be removed after forming the connection between the first joining member 10 and the second joining member 20 and the joining members 10, 20 may be removed from the support surface 400.

Heat is usually applied to the joining members 10, 20 by heating either the first part 41 or the second part 42 or both. By arranging the at least one foil 50, 51 between the stack of joining members 10, 20 and the second part 42, heat transfer from the second part 42 to the stack of joining members 10, 20 may be delayed. That is, the second part 42 may be lowered onto the stack of joining members 10, 20 and a force F may be exerted for the duration of a certain time interval. However, heat is not immediately applied to the stack of joining members 10, 20 at the beginning of this time interval, because the at least one foil 50, 51 needs to be heated first before heat may be further transferred to the stack of joining members 10, 20. This may advantageously influence the (sintered) connection between the first and second joining members 10, 20.

Generally, using a first carrier element 60 for arranging the at least one foil 50, 51 above the stack of joining members 10, 20 substantially simplifies the handling of the at least one foil 50, 51. Further, the foils 50, 51 may be prevented from shifting out of place before and during the joining process. The first carrier element 60 may be arranged in a defined position with respect to the first part 41, and the at least one foil 50, 51 may be arranged at a defined distance d1 from the stack of joining members 10, 20 in the vertical direction y.

Arranging a compensation foil 50 on the first carrier element 60, and subsequently between the second part 42 and the stack of joining members 10, 20 is only an example. As is exemplarily illustrated in FIG. 5, it is also possible to attach a compensation foil 50 or parts of a compensation foil 50 to the second part 42. For example, a piece of compensation foil 50 may adhere to each of the punches of a second part 42. The stack of foils in this example may only comprise a protective foil 51. Generally, however, any other additional or alternative foils may be arranged on the first carrier element 60.

Figure 5:
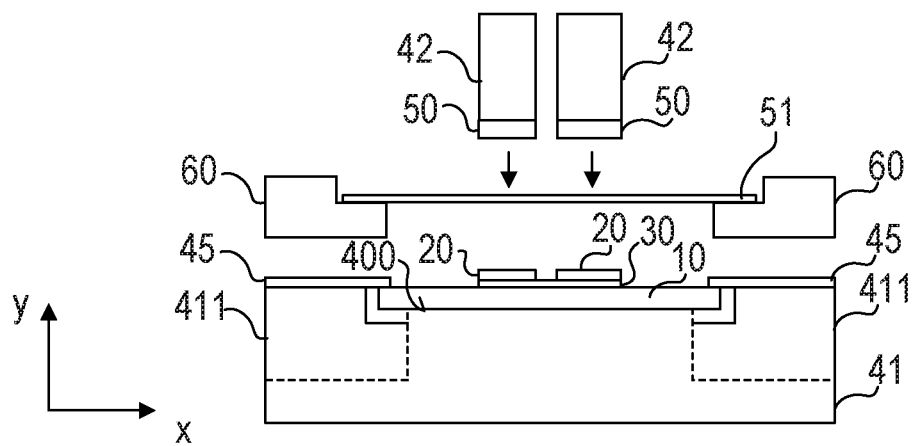
FIG. 5 schematically illustrates a cross-sectional view of another arrangement for joining two joining members.

As is further illustrated in FIG. 5, the arrangement may optionally comprise second holding elements 45. The second holding elements 45 may be arranged on the first part 41, in particular on the first sections 411 of the first part 41. When the first carrier element 60 is arranged in its final resting position, the second holding elements 45 are arranged between the first carrier element 60 and the first sections 411 of the first part 41. The optional second holding elements 45 are configured to hold the first joining member 10 in place during the joining process. In particular, the second holding elements 45 may prevent the first joining member 10 from shifting by holding it down onto the first part 41. For example, the second holding elements 45 may protrude in a horizontal direction x such that they are partly arranged adjacent to the edge regions of the first joining member 10. Often, the at least one second joining member 20 is not arranged on the edge regions of the first joining member 10 such that the edge regions of the first joining member 10 are not covered by the at least one second joining member 20 or the connecting layer 30. The second holding elements 45 may be separate elements, as illustrated in FIG. 5, or may be integrated in the first carrier element 60, for example.

Figure 7:
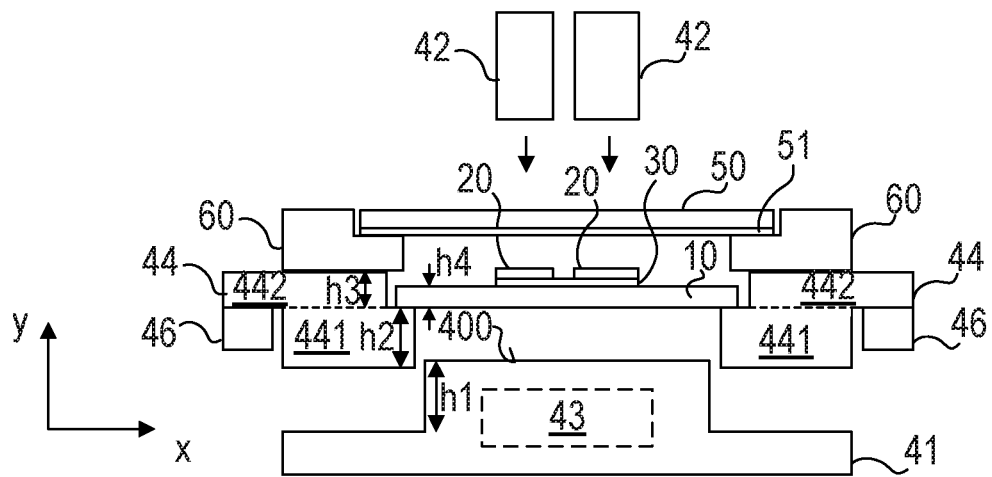
FIG. 7 schematically illustrates a cross-sectional view of another arrangement for joining two joining members before joining the joining members.

Now referring to FIG. 7, the arrangement may further comprise a support frame 44 that is configured to hold and carry the joining stack before arranging the joining stack in its resting position on the first part 41. The support frame 44 may comprise a first section 441 and a second section 442. The first section 441 may be a section arranged closest to the first part 41. The first section 441 may comprise a protrusion on which the joining stack may rest before placing it in its resting position on the first part 41. The support frame 44 subsequently may be set down on resting areas of the first part 41 (see, e.g., FIG. 8). Such resting areas are exemplarily illustrated as protrusions in FIGS. 7 and 8. The support surface 400 may be arranged at a first height h1 above the resting areas in the vertical direction y. The first section 441 of the support frame 44 may have a second height h2 in the vertical direction y. The second height h2 may be equal to or less than the first height h1. In this way, it may be ensured that the first joining member 10 is laid upon the support surface 400 when the second carrier element 44 rests on the first part 41, as is exemplarily illustrated in FIG. 8, for h1=h2. In the example illustrated in FIG. 7, the first part 41 may not comprise first sections 411, as have been described with respect to FIGS. 2 to 6 above.

The second section 442 may have a third height h3 in the vertical direction y. The third height h3 may be equal to or greater than a fourth height h4 of the first joining member 10. This may help to ensure that the first carrier element 60 rests on the support frame 44 instead of on the first joining member 10, when the first carrier element 60 has reached its final resting position.

Figure 8:
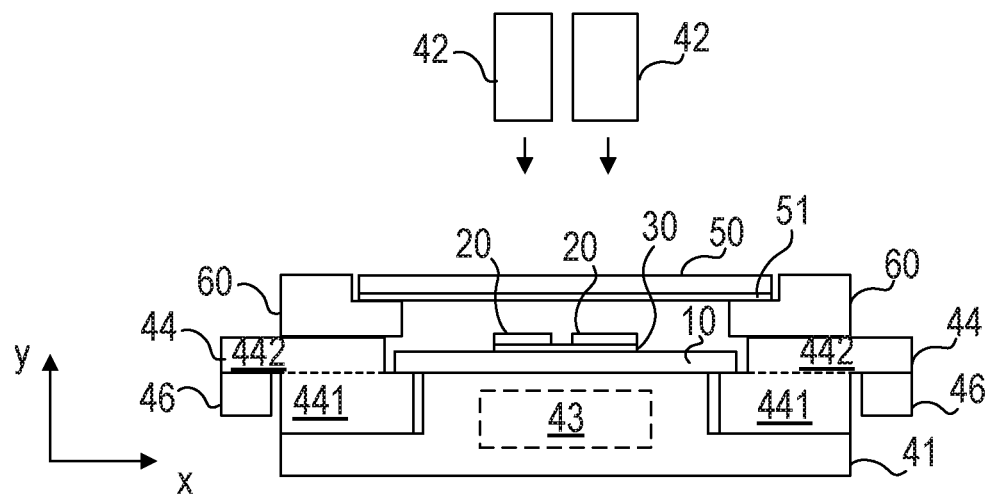
FIG. 8 schematically illustrates a cross-sectional view of the arrangement of FIG. 7 before joining the joining members.
Figure 9:
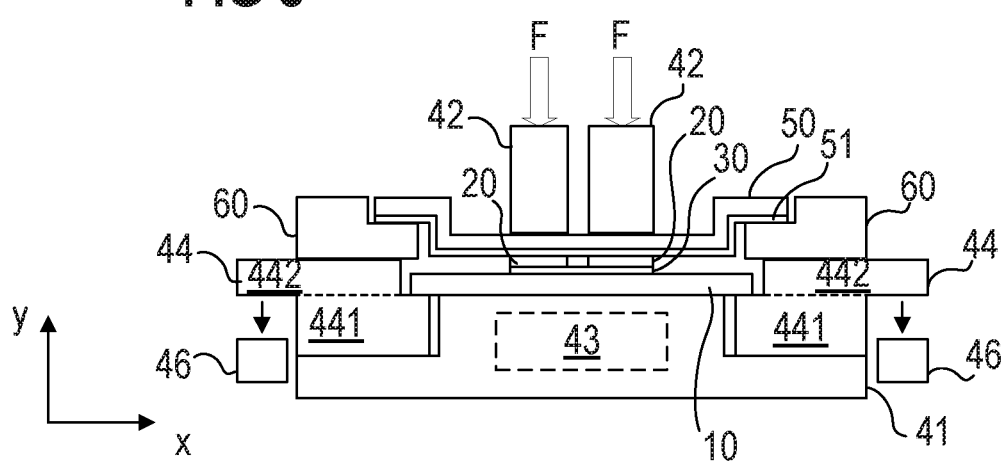
FIG. 9 schematically illustrates a cross-sectional view of the arrangement of FIG. 7 while joining the joining members.

The exemplary arrangement with the support frame 44 and the first carrier element 60 in their final resting positions is illustrated in FIG. 8. The foil stack is arranged at a first distance above the joining stack, as has been described with respect to FIG. 3 above. Again, a transportation unit configured to pick up and transport the first carrier element 60 is not explicitly illustrated in FIGS. 7 to 9. The support frame 44 may be placed on the first part 41 by means of a second carrier element 46, for example. In FIGS. 7 and 8, the second carrier element 46 is illustrated in a holding position. For example, the second section 442 of the support frame 44 may form a protrusion which allows the second carrier element 46 to lift the support frame 44 in the vertical direction y. The second carrier element 46 may be part of a robotic unit, for example (not specifically illustrated in FIGS. 7-9). Once the support frame 44 is arranged in its final resting position, the second carrier element 46 may be removed, as is exemplarily illustrated in FIG. 9. FIG. 9 schematically illustrates the arrangement of FIGS. 7 and 8 while exerting a force F to the joining stack.

Figure 10:
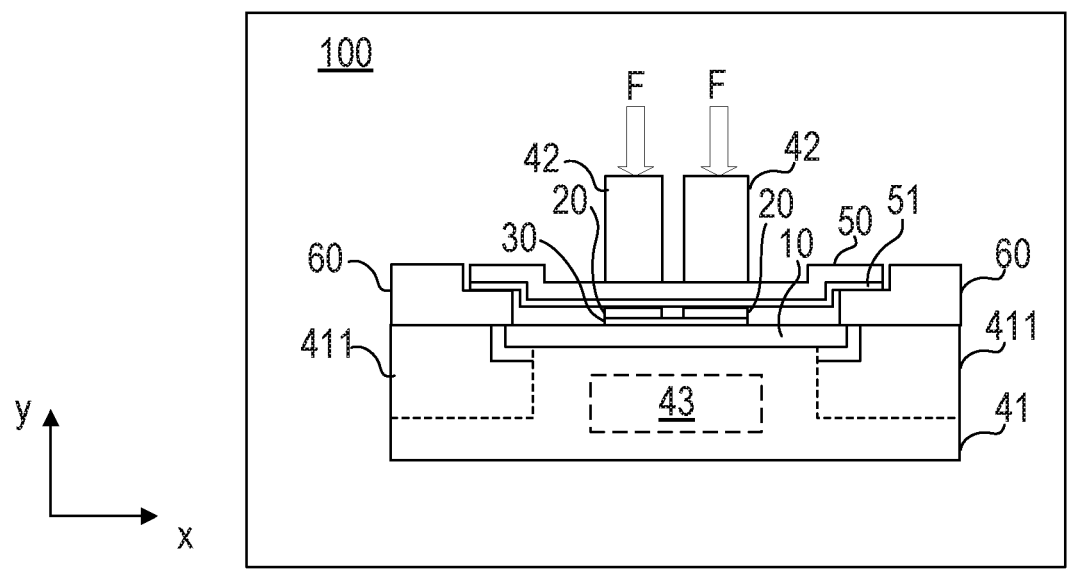
FIG. 10 schematically illustrates a cross-sectional view of another arrangement for joining two joining members.

As has been mentioned above, the joining process may be performed in a process chamber. The process chamber 100 may comprise one or more separate sub-chambers, for example. According to one example (see FIG. 10), the process chamber 100 comprises a single sub-chamber. For example, the one or more foils 50, 51 may first be arranged above the joining stack and subsequently the arrangement comprising the joining stack and the foil stack may be transferred into the process chamber 100. According to another example, the joining stack may be assembled inside the process chamber 100 and the at least one foil 50, 51 may subsequently be arranged above the joining stack. The process chamber 100 may then be closed and a defined atmosphere may be generated inside the process chamber 100. For example, a vacuum may be generated inside the process chamber 100 or the process chamber 100 may be filled with a protective gas. Then, the joining process may be performed by applying pressure to the joining stack and subsequently, the joining stack may remain in the process chamber 100 in the defined atmosphere until it has cooled down to a defined temperature. This, however, is only an example. If the process chamber 100 comprises only a single sub-chamber, performing a plurality of subsequent joining processes requires a comparably long time. This is, because each joining stack needs to remain in the same sub-chamber of the process chamber 100 from the beginning of the process (generating a controlled atmosphere) until the very end of the process (joining stack cooled down to defined temperature).

Therefore, in some cases it might be more efficient if the process chamber 100 comprises two or more sub-chambers. An arrangement for joining two joining members that is arranged in a process chamber 100 comprising three sub-chambers 101, 102, 103 is exemplarily illustrated in FIG. 11. The one or more foils 50, 51 may first be arranged above the joining stack and subsequently the arrangement may be transferred into the first sub-chamber 101 of the process chamber. It is also possible to arrange the foil stack with respect to the joining stack inside the first sub-chamber 101. A defined atmosphere may be created inside the first sub-chamber 101.

The joining stack and the foil stack may then be transferred to a second sub-chamber 102. The actual joining process may be performed in the second sub-chamber 102. A passage between the first sub-chamber 101 and the second sub-chamber 102 may be sealed while the joining process is performed in the second sub-chamber 102. While the joining process is performed in the second sub-chamber 102, the next foil stack may be arranged on the next joining stack in the first sub-chamber 101 and the defined atmosphere may be generated in the first sub-chamber 101. After performing the joining process, the joining stack may be transferred to a third sub-chamber 103. The third sub-chamber 103 may also provide a defined atmosphere. That is, the joining stack may cool down in the third sub-chamber 103 in a defined atmosphere. At the same time, the next joining stack may be moved from the first sub-chamber 101 to the second sub-chamber 102 and the next joining process may be performed. Simultaneously, another joining stack and foil stack may be transferred to the first sub-chamber 101 and a defined atmosphere may be generated. In this way, different joining stacks may be arranged in the different sub-chambers 101, 102, 103 and different sub-processes may be performed simultaneously.

After joining the joining members 10, 20, it is possible that only the joined joining members 10, 20 are transferred to the third sub-chamber 103. The foil stack, on the other hand, may be transferred back to the first sub-chamber 101, for example, to be reused in the next joining process.

At least some of the foils 50, 51 may be reused for a following joining process. For example, the compensation foil 50 may be used during two or more joining processes (e.g., 20 joining processes). The protective foil 51 may also be used during two or more joining processes. According to one example, the protective foil 51 may be replaced more frequently than the compensation foil 50. Arranging the foils 50, 51 on the first carrier element 60 simplifies the process of exchanging one or more foils in between two joining processes. The exchange of one or more foils 50, 51 may be performed inside the first sub-chamber 101, for example. Exchanging one or more foils 50, 51 may be performed manually or automated. In the third sub-chamber 103, the joined joining members 10, 20 may be further treated. For example, the joining members 10, 20 may be cleaned or cooled down in the third sub-chamber 103. If a support frame 44 is used for carrying the joining members 10, 20, the joining members may be unloaded from the support frame 44 inside the third sub-chamber 103 or after removing the joining members 10, 20 from the third sub-chamber 103.

Figure 11:
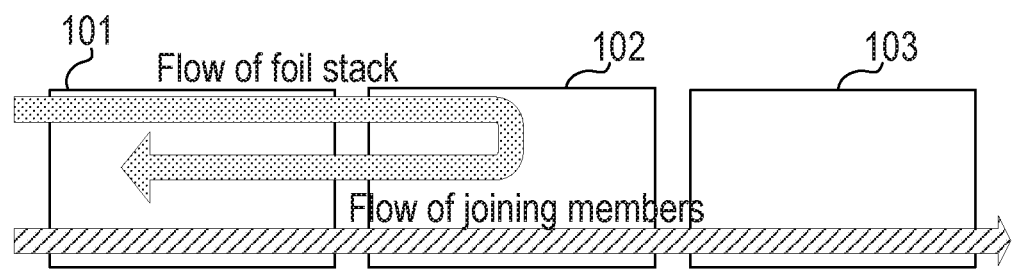
FIG. 11 schematically illustrates an exemplary flow of different components in an arrangement comprising several process chambers.
Figure 12:
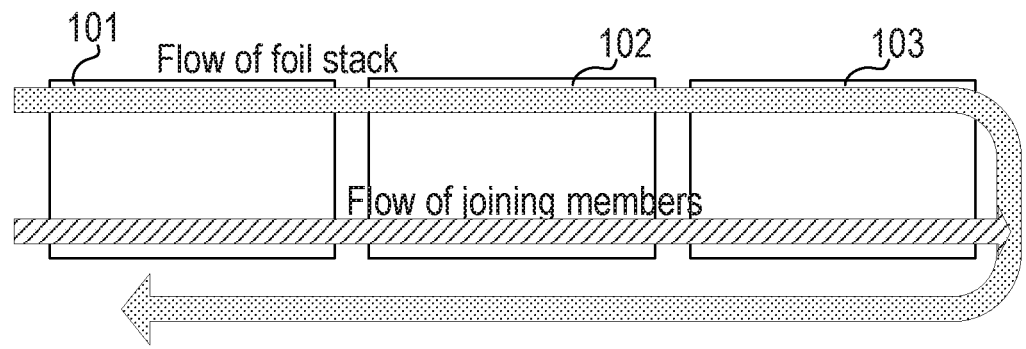
FIG. 12 schematically illustrates another exemplary flow of different components in an arrangement comprising several process chambers.
Figure 13:
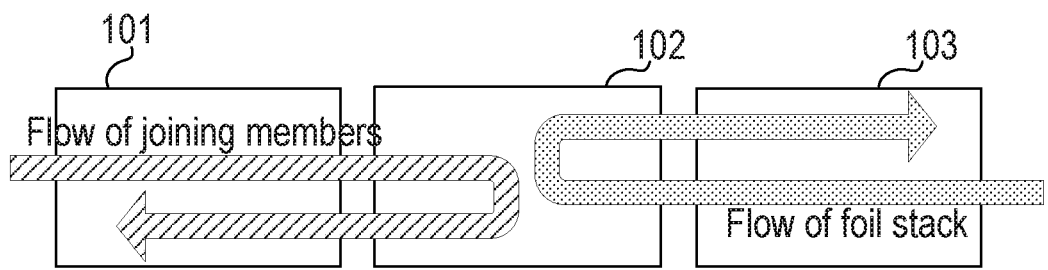
FIG. 13 schematically illustrates another exemplary flow of different components in an arrangement comprising several process chambers.

According to another example, as illustrated in FIG. 12, the arrangement may be assembled before transferring the arrangement to the first sub-chamber 101, as has been described with respect to FIG. 11 above, or the assembly may take place inside the first sub-chamber 101. A defined atmosphere may be generated inside the first sub-chamber 101 and the joining stack may then be transferred to the second sub-chamber 102. The joining process may subsequently be performed in the second sub-chamber 102. The foil stack, however, may subsequently be transferred to the third sub-chamber 103 together with the joining members 10, 20. That is, the foil stack may pass through the same sub-chambers 101, 102, 103 as the joining members 10, 20. After exiting the third sub-chamber 103, the foil stack may be transferred back to the first sub-chamber 101, while the joining members 10, 20 are removed from the arrangement. According to an even further example, which is schematically illustrated in FIG. 13, the foil stack may be prepared in the third sub-chamber 103 or before transferring the foil stack to the third sub-chamber 103, while the joining members 10, 20 are prepared in the first sub-chamber 101 or before transferring the joining stack to the first sub-chamber 101. The arrangement may be fully assembled in the second sub-chamber 102. The joining process may then be performed in the second sub-chamber 102. Afterwards, the foil stack may be transferred back to the third sub-chamber 103, while the joining members 10, 20 are transferred back to the first sub-chamber 101 for further processing (e.g., cooling). That is, in the example illustrated in FIG. 13, creating the defined atmosphere and cooling down of the joining stack may take place in the same sub-chamber (e.g., first sub-chamber 101), in contrast to what has been described with respect to FIGS. 11 and 12.

According to one example, the foils are provided on reels/rolls and pieces of foils may be cut off the reels/rolls before assembling the foils on the first carrier element 60. According to one example, each of the foils may be provided on a separate reel. However, it is also possible to provide a ribbon of stacked foils on a single reel. A robotic unit may pick up the cut ribbon and, if necessary, assemble the foil stack on the first carrier element 60. Another robotic unit (transportation unit) may then transfer the first carrier element 60 with the foil stack arranged thereon to the process chamber. An even further robotic unit may transfer the joining stack to the process chamber. The whole assembly of the arrangement, therefore, may be implemented automatic and therefore comparably fast and cost effective. A carrier may be arranged next to the process chamber. For example, a plurality of support frames with joining members arranged thereon may be inserted in the carrier. The respective robotic unit may grasp one of the support frames and place it inside the process chamber. After performing the joining process, the support frame may be transferred back to the carrier and the next support frame may be arranged inside the process chamber. Each of the robotic units may comprise a vacuum unit that is configured to picking up elements by generating a vacuum. The assembly process may comprise pick and place processes.

In an exemplary production line, the joining members 10, 20 may enter the production line at a loader. In a next chamber (cleaning module), the joining members 10, 20 may be cleaned. In a subsequent assembly chamber (sinter stack module), the joining members 10, 20 may be arranged on a support frame. According to one example, more than one joining stack is arranged on each support frame. The support frame with the joining members 10, 20 arranged thereon is then transferred to a process chamber (sinter press module). The foil stack may be arranged above the joining stack in the assembly chamber, for example, and may enter the process chamber together with the joining stack. After forming the connection between the joining members 10, 20, the whole arrangement may be transferred to a cooling chamber (cooling module). The foil stack, however, may be transferred back from the cooling chamber to the assembly chamber for reuse. After cooling the joining members, the support frame may be unloaded. That is, the now connected joining members may be removed from the support frame. The support frame may be reused. The same applies for the first carrier element, which may also be reused. Only the foils need to be replaced after one or more subsequent processes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An arrangement for joining two joining members, comprising:
    a first part comprising a support surface;
    a first carrier element configured to carry at least one foil;
    a transportation unit configured to arrange the first carrier element with the at least one foil arranged thereon in such a way that the at least one foil is arranged above the support surface of the first part in a vertical direction; and
    a second part configured to exert pressure to a joining stack, when the joining stack is arranged on the support surface,
wherein the joining stack comprises a first joining member arranged on the support surface, a second joining member, and an electrically conductive connection layer arranged between the first joining member and the second joining member,
wherein when pressure is exerted on the joining stack by the second part, the at least one foil is arranged between the second part and the joining stack and is pressed onto the joining stack and the joining stack is pressed onto the first part, thereby compressing the connection layer and forming a bond between the first joining member and the second joining member.

2. The arrangement of claim 1, wherein when the at least one foil carried by the first carrier element is arranged above the support surface, and before pressure is exerted on the joining stack by the second part, a first foil of the at least one foil that is arranged closest to the joining stack is arranged at a first distance greater than zero from an uppermost surface of the joining stack.

3. The arrangement of claim 1, wherein the first carrier element comprises a frame with a projection, and wherein when the at least one foil is carried by the first carrier element an edge region of the at least one foil rests on the projection of the frame.

4. The arrangement of claim 1, wherein at least one of the first part and the second part comprises a heating element.

5. The arrangement of claim 1, further comprising a second carrier element configured to carry the joining stack before arranging the joining stack on the support surface of the first part.

6. The arrangement of claim 5, wherein when the at least one foil is arranged above the support surface of the first part, the first carrier element is arranged on the second carrier element.

7. The arrangement of claim 1, wherein when the at least one foil is arranged above the support surface of the first part, the first carrier element is partly arranged above an edge region of the first joining member in the vertical direction.

8. The arrangement of claim 1, wherein the first carrier element comprises fastening or holding means configured to hold the at least one foil in place, when the at least one foil is arranged on the first carrier element.

9. The arrangement of claim 1, wherein the at least one foil comprises a compensation foil configured to evenly distribute a pressure exerted by the second part over the joining stack.

10. The arrangement of claim 9, wherein the compensation foil comprises silicone heat-resistant rubber material, or an elastomer that is resistant to heat at least up to temperatures between 150° C. and 250° C.

11. The arrangement of claim 1, wherein the at least one foil comprises a protective foil configured to prevent contaminants from contaminating the joining members.

12. The arrangement of claim 11, wherein the protective foil comprises an inert polymer or a polyimide.

13. The arrangement of claim 1, further comprising holding elements configured to be arranged on the first part, wherein when the first carrier element is arranged in a final resting position on the first part, the holding elements are configured to be arranged between the first carrier element and the first part.

14. The arrangement of claim 13, wherein the holding elements are configured to hold down the first joining member on the support surface in the vertical direction.

15. The arrangement of claim 1, further comprising a first robotic unit configured to pick up the at least one foil and assemble the at least one foil on the first carrier element.

16. The arrangement of claim 15, further comprising a second robotic unit configured to transfer the first carrier element with the at least one foil arranged thereon to a process chamber.

17. The arrangement of claim 16, further comprising a third robotic unit configured to transfer the joining stack to the process chamber.

18. A method, comprising:
    arranging a first joining member, an electrically conductive connection layer, and a second joining member on a support surface of a first part to form a joining stack, wherein the electrically conductive connection layer is arranged between the first joining member and the second joining member;
    arranging at least one foil on a first carrier element;
    using a transportation unit to arrange the first carrier element such that the at least one foil is arranged above the support surface of the first part in a vertical direction; and
    exerting pressure to the joining stack by a second part, wherein when the at least one foil is arranged above the support surface and pressure is exerted on the joining stack by the second part, the at least one foil is arranged between the second part and the joining stack and is pressed onto the joining stack, and the joining stack is pressed onto the first part, thereby compressing the connection layer and forming a bond between the first joining member and the second joining member.

19. The method of claim 18, wherein forming the bond between the first joining member and the second joining member is performed in a process chamber comprising one or more sub-chambers, and wherein either the joining stack and the first carrier element with the at least one foil are both assembled and transferred into a first sub-chamber, wherein a defined atmosphere is generated in the first sub-chamber and the joining stack and the foil stack are subsequently transferred to a second sub-chamber, and wherein the joining process is performed in the second sub-chamber.

20. The method of claim 18, wherein the joining stack is assembled and transferred into a first sub-chamber, wherein a defined atmosphere is generated in the first sub-chamber, wherein the first carrier element with the at least one foil is assembled in a third sub-chamber, wherein the joining stack and the first carrier element with the at least one foil arranged thereon are subsequently transferred to a second sub-chamber, and wherein the joining process is performed in the second sub-chamber.

* * * * *